(12) United States Patent
Fujimoto

(10) Patent No.: US 12,276,823 B2
(45) Date of Patent: Apr. 15, 2025

(54) LIGHT SOURCE MODULE

(71) Applicant: KYOCERA Corporation, Kyoto (JP)

(72) Inventor: Yasuhiro Fujimoto, Setouchi (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 18/564,415

(22) PCT Filed: May 26, 2022

(86) PCT No.: PCT/JP2022/021620
§ 371 (c)(1),
(2) Date: Nov. 27, 2023

(87) PCT Pub. No.: WO2022/250118
PCT Pub. Date: Dec. 1, 2022

(65) Prior Publication Data
US 2024/0288618 A1    Aug. 29, 2024

(30) Foreign Application Priority Data
May 28, 2021 (JP) .............................. JP2021-090061

(51) Int. Cl.
*F21V 8/00* (2006.01)
(52) U.S. Cl.
CPC ......... *G02B 6/0006* (2013.01); *G02B 6/0008* (2013.01)
(58) Field of Classification Search
CPC .............................. G02B 6/0006; G02B 6/0008
See application file for complete search history.

(56) References Cited

U.S. PATENT DOCUMENTS

2003/0147254 A1* 8/2003 Yoneda ................ G02B 6/4298
362/555
2017/0146744 A1   5/2017 Katsuyama et al.
(Continued)

FOREIGN PATENT DOCUMENTS

JP      2005189385 A  *  7/2005  ............. G02B 6/122
JP      2019-105774 A     6/2019
JP      7187148 B2 * 12/2022  ............... G02B 6/12
(Continued)

OTHER PUBLICATIONS

English Machine Translation of Suzuki et al, JP 2005 189 385 (Year: 2024).*

(Continued)

*Primary Examiner* — Donald L Raleigh
(74) *Attorney, Agent, or Firm* — Volpe Koenig

(57) ABSTRACT

A light source module includes a first light emitter, a second light emitter, and a third light emitter each to emit light with a different wavelength, a cladding, and a core in the cladding. The core includes a first waveguide that transmits light emitted from the first light emitter, a second waveguide that transmits light emitted from the second light emitter, a third waveguide that transmits light emitted from the third light emitter, a first merging portion in which two waveguides of the first waveguide, the second waveguide, or the third waveguide merge, a second merging portion in which the first merging portion merges with a waveguide other than the two waveguides of the first waveguide, the second waveguide, or the third waveguide, and an emission portion at one end of the second merging portion.

6 Claims, 5 Drawing Sheets

(56) References Cited

U.S. PATENT DOCUMENTS

2018/0306978 A1 10/2018 Kagawa et al.
2022/0390689 A1 12/2022 Itakura

FOREIGN PATENT DOCUMENTS

| WO | 2015/170505 A1 | 11/2015 |
| WO | 2017/065225 A1 | 4/2017 |
| WO | 2021/065948 A1 | 4/2021 |

OTHER PUBLICATIONS

English Machine Translation of Konegawa et al JP 7187148 (Year: 2024).*

* cited by examiner

LIGHT SOURCE MODULE

TECHNICAL FIELD

The present disclosure relates to a light source module.

BACKGROUND OF INVENTION

A known technique is described in, for example, Patent Literature 1.

CITATION LIST

Patent Literature

Patent Literature 1: WO 2017/065225

SUMMARY

In one or more aspects of the present disclosure, a light source module includes a first light emitter that emits light with a first wavelength, a second light emitter that emits light with a second wavelength different from the first wavelength, a third light emitter that emits light with a third wavelength different from the first wavelength and the second wavelength, a cladding, and a core in the cladding. The core includes a first waveguide that transmits light emitted from the first light emitter, a second waveguide that transmits light emitted from the second light emitter, a third waveguide that transmits light emitted from the third light emitter, a first merging portion in which two waveguides of the first waveguide, the second waveguide, or the third waveguide merge, a second merging portion in which the first merging portion merges with a waveguide other than the two waveguides of the first waveguide, the second waveguide, or the third waveguide, and an emission portion at one end of the second merging portion.

DESCRIPTION OF EMBODIMENTS

The objects, features, and advantages of the present disclosure will be more apparent from the following detailed description and the drawings.

Known display devices project images onto, for example, a display screen using two-dimensional scanning of laser light. Various light source modules have been developed as light sources for such display devices. One such light source module includes a merging portion that combines light beams with different wavelengths (refer to, for example, Patent Literature 1).

The light source module is to be compact and have a simple structure that can efficiently combine light beams with different wavelengths. The light source module described in Patent Literature 1 includes, as a merging portion, a directional coupler that is to be processed with high precision. To reduce light loss, the light source module thus cannot easily have a compact design. A light source module with a merging portion including an optical element such as a mirror or a lens may become larger, with the merging portion including numerous components.

A light source module according to one or more embodiments of the present disclosure will now be described with reference to the accompanying drawings. The drawings used herein are schematic and are not drawn to scale relative to the actual size of each component. Although the light source module according to one or more embodiments of the present disclosure may be oriented with any sides being upward or downward, the light source module herein is defined using the orthogonal coordinate system (X, Y, and Z) for convenience, with its positive Z-direction being upward to have an upper surface or a lower surface. X-direction may be referred to as a length direction. Y-direction may be referred to as a width direction. Z-direction may be referred to as a thickness direction.

Figure 1:
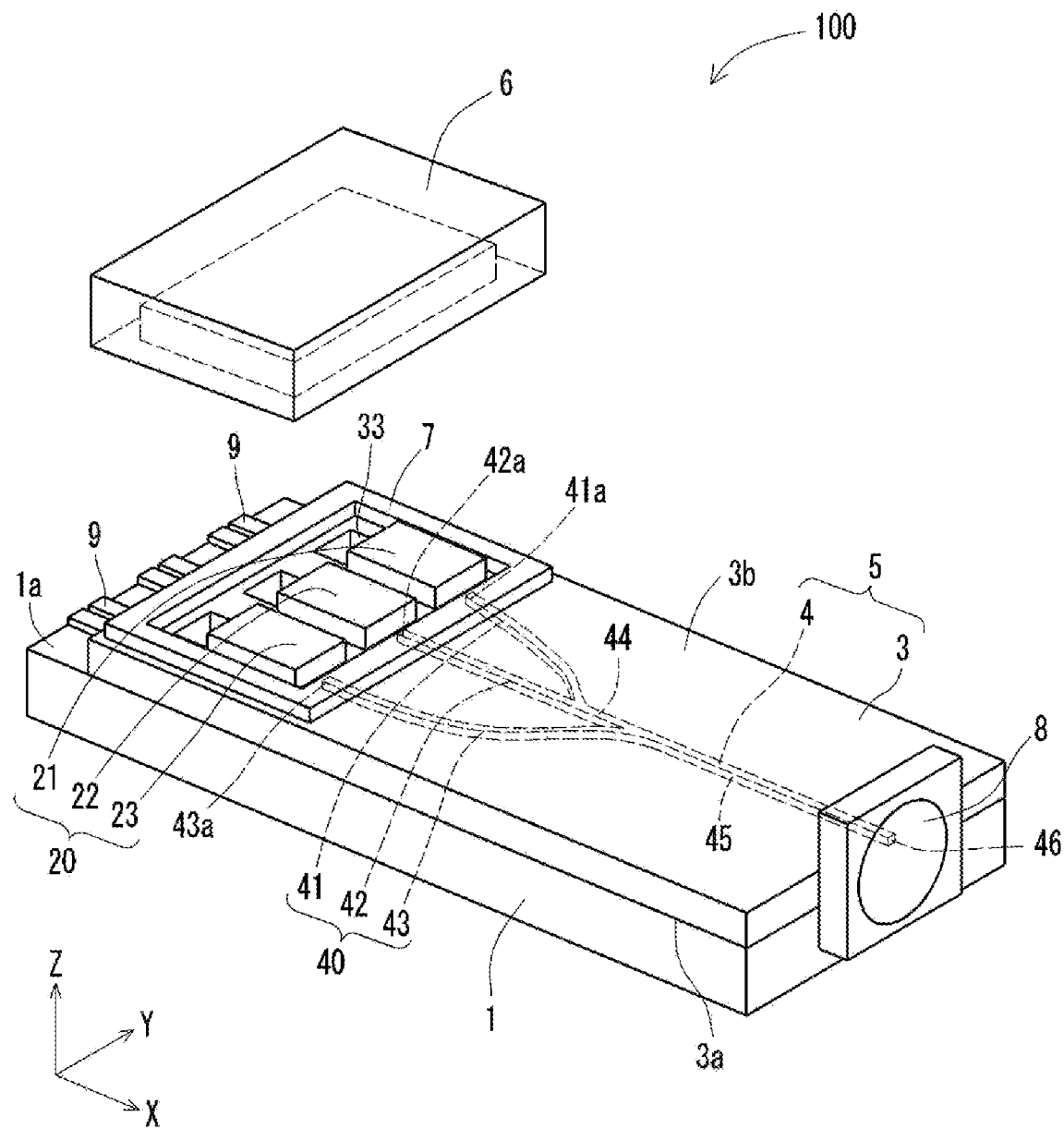
FIG. 1 is an exploded perspective view of a light source module according to an embodiment of the present disclosure.
Figure 2:
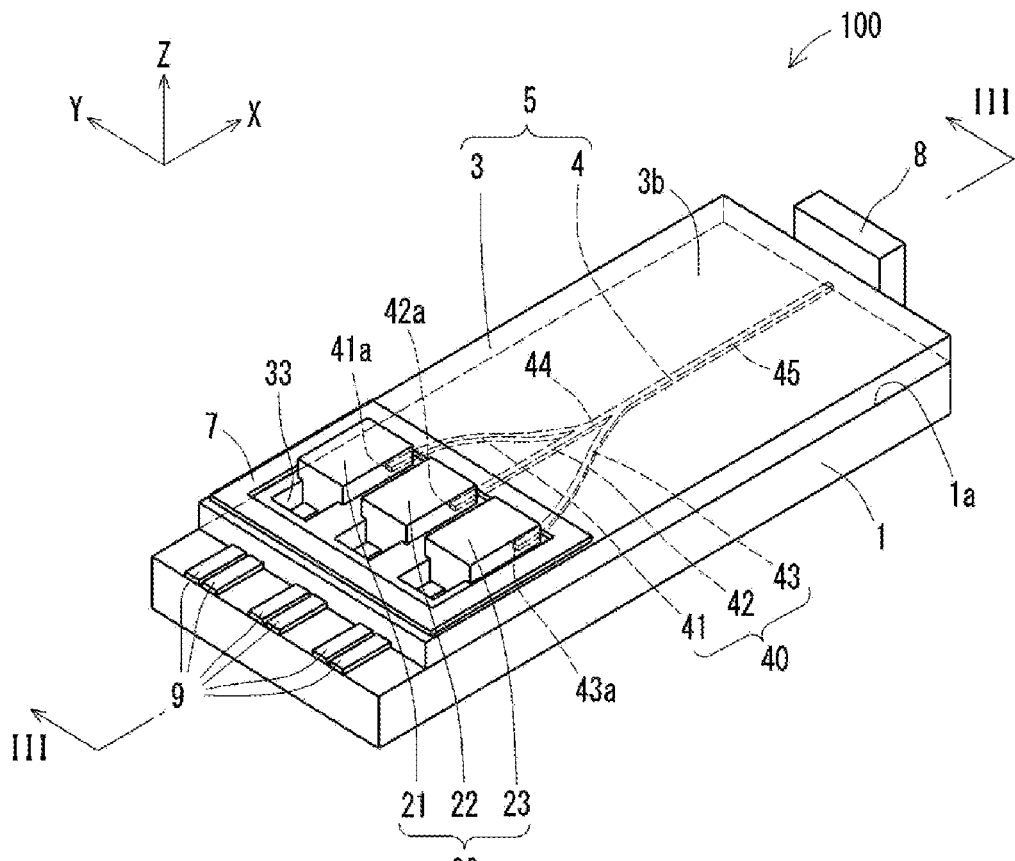
FIG. 2 is a perspective view of the light source module in FIG. 1 without illustrating a lid.
Figure 3:
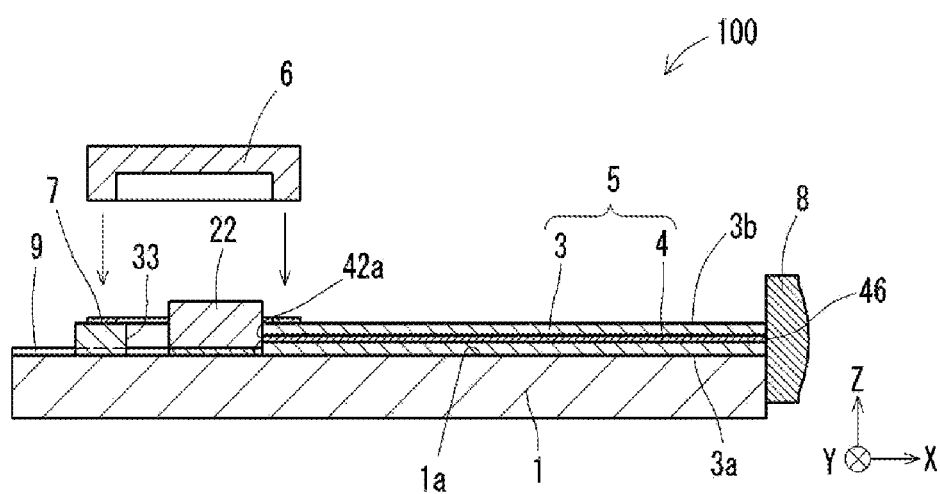
FIG. 3 is a cross-sectional view taken along line III-III in FIG. 2.
Figure 4:
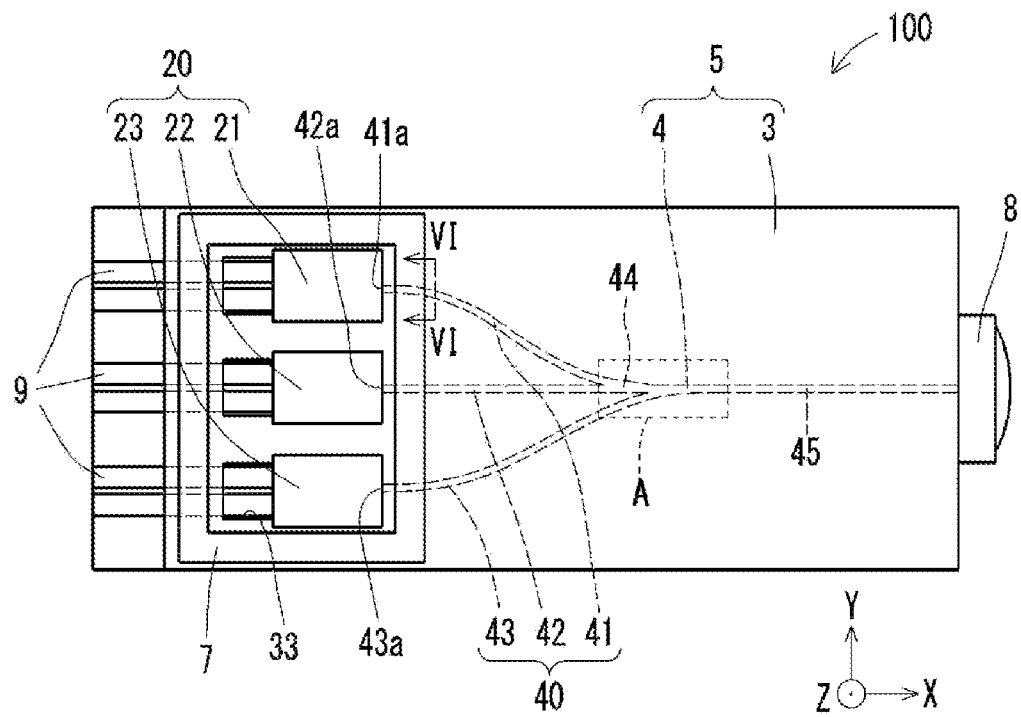
FIG. 4 is a plan view of the light source module in FIG. 1.
Figure 5:
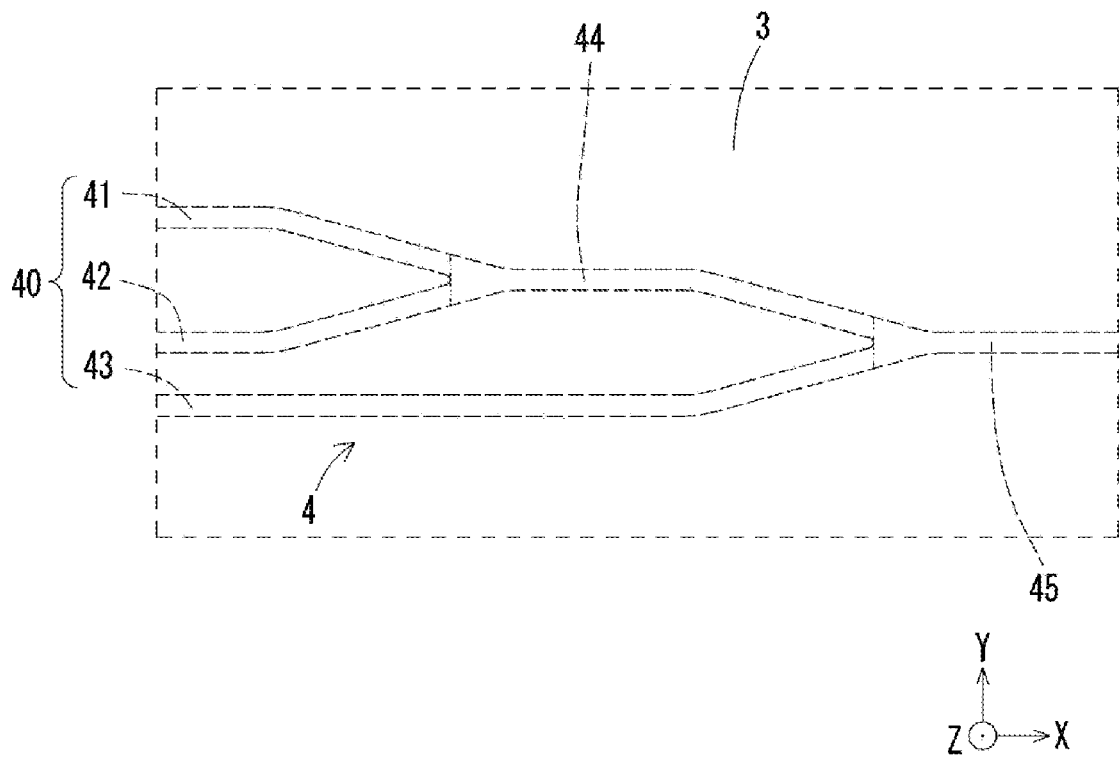
FIG. 5 is a plan view of the light source module in FIG. 1 illustrating its main part in an enlarged manner.
Figure 6:
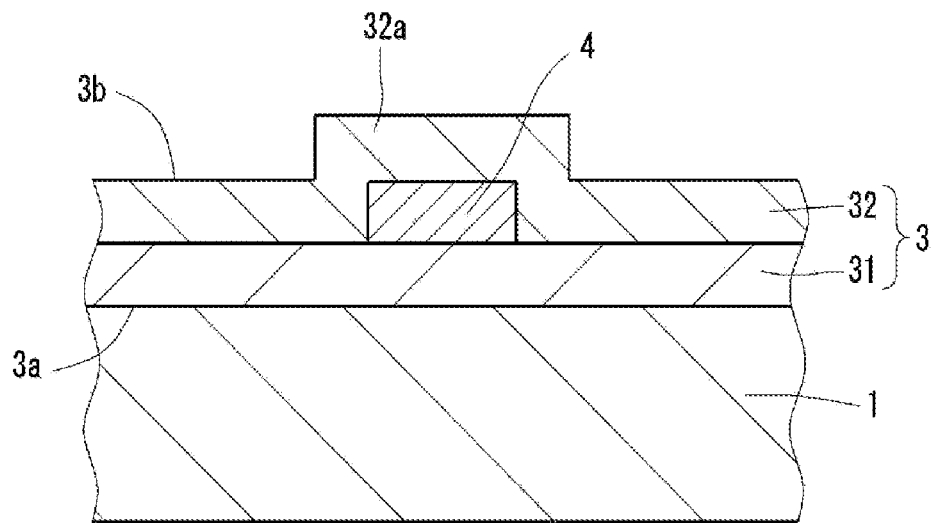
FIG. 6 is an end view taken along line VI-VI in FIG. 4.
Figure 6:
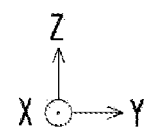
Figure 7:
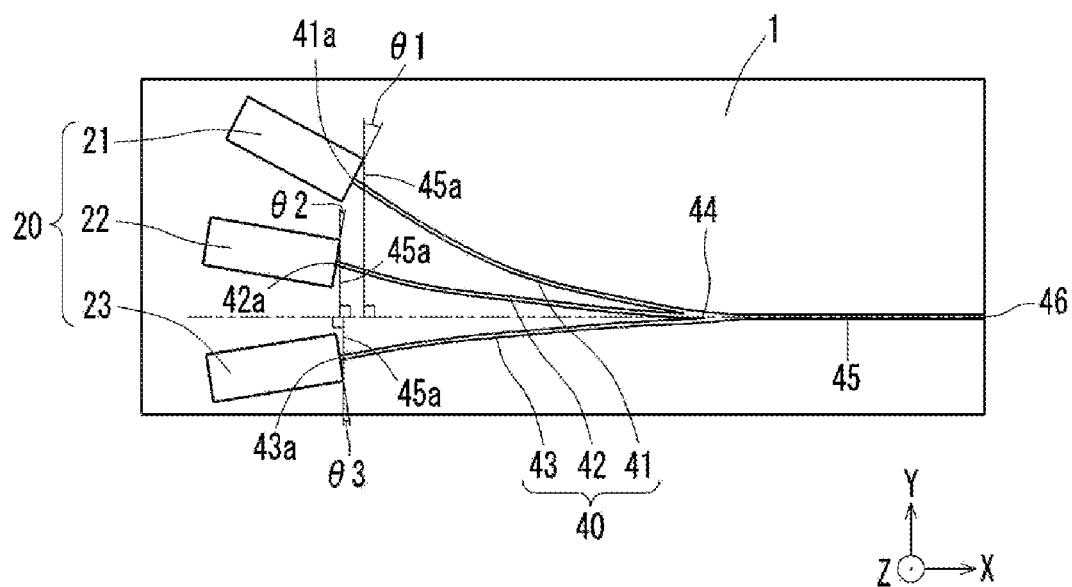
FIG. 7 is a plan view of a light source module according to a variation of the embodiment of the present disclosure.
Figure 7:
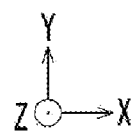
Figure 8:
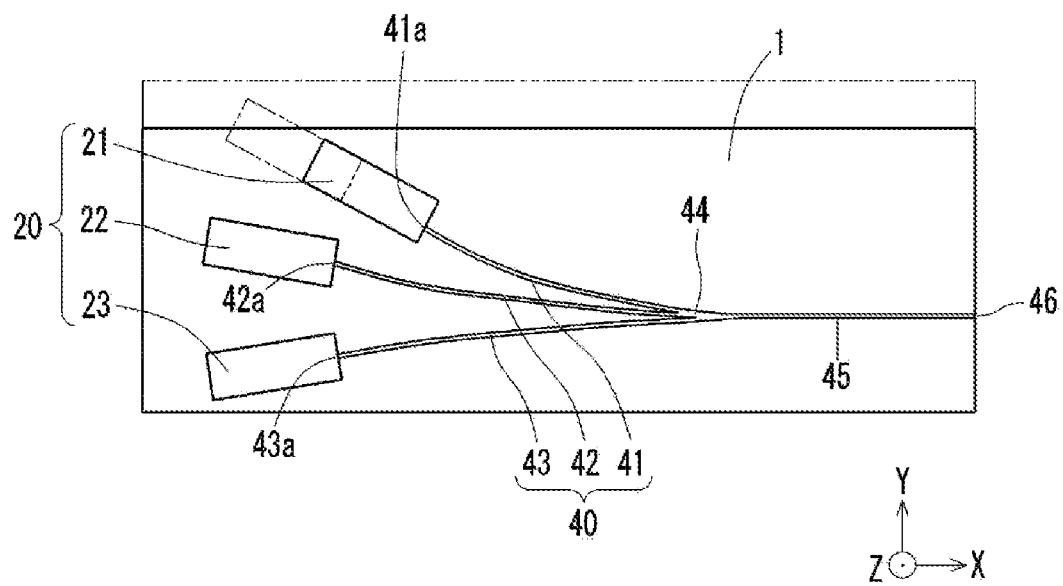
FIG. 8 is a plan view of a light source module according to a variation of the embodiment of the present disclosure.
Figure 9:
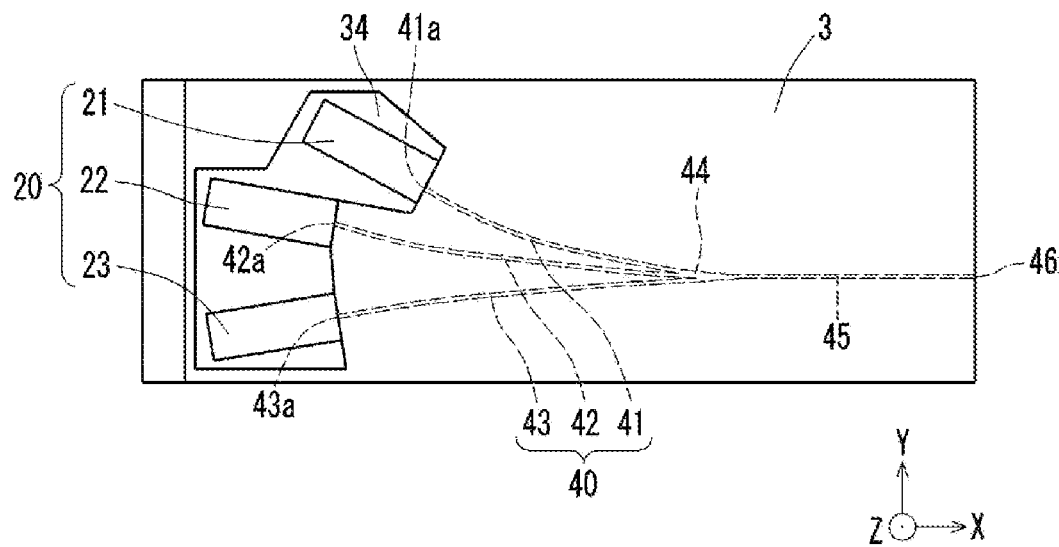
FIG. 9 is a plan view of a light source module according to a variation of the embodiment of the present disclosure.

FIG. 1 is an exploded perspective view of a light source module according to an embodiment of the present disclosure. FIG. 2 is a perspective view of the light source module in FIG. 1 without illustrating a lid. FIG. 3 is a cross-sectional view taken along line III-III in FIG. 2. FIG. 4 is a plan view of the light source module in FIG. 1. FIG. 5 is a plan view of the light source module in FIG. 1 illustrating its main part in an enlarged manner. FIG. 6 is an end view taken along line VI-VI in FIG. 4. FIGS. 7 to 9 are plan views of light source modules according to variations of the embodiment of the present disclosure. FIG. 2 is a perspective view as viewed in a direction different from FIG. 1. FIG. 4 does not illustrate the lid. FIG. 5 is an enlarged view of part A in FIG. 4. FIGS. 7 and 8 illustrate a first light emitter, a second light emitter, a third light emitter, a core, and a substrate. The other components of the light source module are not illustrated in the figures. FIG. 9 illustrates the first light emitter, the second light emitter, the third light emitter, the core, and the substrate. The other components of the light source module are not illustrated in the figure.

In the present embodiment, a light source module 100 includes a first light emitter 21, a second light emitter 22, a third light emitter 23, a cladding 3, and a core 4.

The first light emitter 21, the second light emitter 22, and the third light emitter 23 may be, for example, semiconductor lasers or light-emitting diodes. In the example described below, the first light emitter 21, the second light emitter 22, and the third light emitter 23 are semiconductor lasers. The first light emitter 21, the second light emitter 22, and the third light emitter 23 may not be distinguished from one another and may be collectively referred to as light emitters 20.

The first light emitter 21 emits light with a first wavelength at a peak of the light intensity. The second light emitter 22 emits light with a second wavelength at a peak of the light intensity. The third light emitter 23 emits light with a third wavelength at a peak of the light intensity. The first wavelength, the second wavelength, and the third wavelength differ from one another.

The second wavelength may be, for example, longer than the first wavelength. The third wavelength may be, for example, longer than the second wavelength. The first wavelength may be in a wavelength region of about 400 to 500 nm. The first light emitter 21 that emits light in this wavelength region may be a blue semiconductor laser. The second wavelength may be in a wavelength region of about 500 to 600 nm. The second light emitter 22 that emits light in this wavelength region may be a green semiconductor laser. The third wavelength may be in a wavelength region of about 600 to 700 nm. The third light emitter 23 that emits light in this wavelength region may be a red semiconductor laser.

An optical waveguide layer 5 includes the cladding 3 and the core 4. As illustrated in, for example, FIGS. 1 to 6, the core 4 is located in the cladding 3. The light source module 100 may include a substrate 1. In this case, the cladding 3 is located on a first surface 1a of the substrate 1, and the core 4 extends along the first surface 1a.

The substrate 1 may be a ceramic wiring board made of a ceramic material. Examples of the ceramic material used for the ceramic wiring board include sintered aluminum oxide, sintered mullite, sintered silicon carbide, sintered aluminum nitride, and sintered glass ceramic. The ceramic wiring board may include conductors such as connection pads, internal wiring conductors, and external connection terminals for electrical connection between the light emitters 20 and an external circuit. The ceramic wiring board may be a stack.

The substrate 1 may be an organic wiring board made of an organic material. The organic wiring board may be a printed wiring board, a build-up wiring board, or a flexible wiring board. Examples of the organic material used for the organic wiring board include an epoxy resin, a polyimide resin, a polyester resin, an acrylic resin, a phenolic resin, and a fluororesin. The organic wiring board may be a stack.

The substrate 1 may be made of a compound semiconductor such as gallium nitride (GaN), gallium arsenide (GaAs), or indium phosphorus (InP), or may be made of silicon (Si), germanium (Ge), or sapphire ($Al_2O_3$).

The optical waveguide layer 5 may be made of glass such as quartz, or a resin such as polymethyl methacrylate or a fluororesin. The cladding 3 and the core 4 in the optical waveguide layer 5 may be made of glass or a resin. In some embodiments, one of the cladding 3 or the core 4 may be made of glass and the other may be made of a resin. The core 4 has a higher refractive index than the cladding 3. The optical waveguide layer 5 totally internally reflects light propagating through the core 4 using the cladding 3 and the core 4 with different refractive indexes. The optical waveguide layer 5 includes a path made of a material with a higher refractive index and surrounded by a material with a lower refractive index. The optical waveguide layer 5 can thus confine light inside the core 4 with the higher refractive index. Light propagates through the core 4 while being totally internally reflected repeatedly from the boundary between the core 4 and the cladding 3.

As illustrated in, for example, FIG. 6, the cladding 3 may include a lower cladding layer 31 and an upper cladding layer 32 stacked on each other. The core 4 may extend between the lower cladding layer 31 and the upper cladding layer 32. The upper cladding layer 32 may include, on its upper surface opposite to the lower surface facing the lower cladding layer 31, a ridge 32a in conformance with the core 4.

In the optical waveguide layer 5, the cladding 3 and the core 4 may have a refractive index difference of 0.05 to 0.30 between them. In this case, the optical waveguide layer 5 can stably transmit light in a multi-mode. The optical waveguide layer 5 can be formed using techniques similar to, for example, photolithography and etching used in the semiconductor device manufacturing process.

In the present embodiment, the core 4 includes a first waveguide 41, a second waveguide 42, and a third waveguide 43. The first waveguide 41 transmits light emitted from the first light emitter 21. The first waveguide 41 includes a first incident surface 41a that receives light emitted from the first light emitter 21. The first incident surface 41a faces a light emission surface of the first light emitter 21. The second waveguide 42 transmits light emitted from the second light emitter 22. The second waveguide 42 includes a second incident surface 42a that receives light emitted from the second light emitter 22. The second incident surface 42a faces a light emission surface of the second light emitter 22. The third waveguide 43 transmits light emitted from the third light emitter 23. The third waveguide 43 includes a third incident surface 43a that receives light emitted from the third light emitter 23. The third incident surface 43a faces a light emission surface of the third light emitter 23. The first waveguide 41, the second waveguide 42, and the third waveguide 43 may be hereafter collectively referred to as waveguides 40.

In the present embodiment, the core 4 further includes a first merging portion 44, a second merging portion 45, and an emission portion 46. Two of the first waveguide 41, the second waveguide 42, or the third waveguide 43 merge in the first merging portion 44. The second merging portion 45 is located nearer the emission portion 46 than the first merging portion 44. The waveguide other than the two of the first waveguide 41, the second waveguide 42, or the third waveguide 43 merges with the first merging portion 44 in the second merging portion 45. The second merging portion 45 may extend linearly. The emission portion 46 is located at one end of the second merging portion 45. As illustrated in, for example, FIG. 1, the emission portion 46 is located at one end of the second merging portion 45 opposite to the first merging portion 44. Light beams emitted from the light emitters 20 are combined in the first merging portion 44 and the second merging portion 45 and are emitted outside through the emission portion 46. In this manner, the first waveguide 41 and the second waveguide 42 merge in the first merging portion 44, and the third waveguide 43 and the first merging portion 44 merge in the second merging portion 45. This structure efficiently combines light beams with different wavelengths.

In the above structure, at least one of the two waveguides merging in the first merging portion 44 may have greater bending (curvature). However, the first merging portion 44 is located nearer the light emitters 20 than the second merging portion 45, and the waveguide with the greater bending is short up to the first merging portion 44. This structure reduces light loss (hereafter simply referred to as loss) that may result from the bending in the waveguide. The length of the waveguide herein refers to the length of the waveguide in the direction of light propagation.

The light source module 100 includes a single waveguide that merges with the first merging portion 44 in the second merging portion 45. The single waveguide is relatively long and may thus have smaller bending to reduce loss.

As described above, the light source module 100 has less light loss in the waveguides 40, and thus can efficiently combine light beams with different wavelengths. The light source module 100 includes the first merging portion 44 and the second merging portion 45 each including no directional coupler or no optical element such as a mirror or a lens. The light source module 100 is thus compact and has a simple structure.

In the example below, the second wavelength is longer than the first wavelength, and the third wavelength is longer than the second wavelength. In this example, the first light emitter 21 is a blue semiconductor laser, the second light emitter 22 is a green semiconductor laser, and the third light emitter 23 is a red semiconductor laser.

The light source module 100 may include the first waveguide 41 and the second waveguide 42 merging in the first merging portion 44, and the third waveguide 43 and the first merging portion 44 merging in the second merging portion 45. Light with the third wavelength emitted from the red semiconductor laser is more likely to have bending loss than light with the first wavelength emitted from the blue semiconductor laser and light with the second wavelength emitted from the green semiconductor laser. The third waveguide 43 may thus have smaller bending before merging with the first merging portion 44 in the second merging portion 45. This reduces bending loss in the third waveguide 43. Light with the first wavelength is less likely to have bending loss than light with the third wavelength. The first waveguide 41 may thus have greater bending and is shorter to reduce loss. The first waveguide 41 thus has a smaller width in Y-direction. The light source module 100 with this structure has reduced bending loss in the waveguides 40, and can efficiently combine light beams with different wavelengths. The light source module 100 with the structure reflecting such bending loss in light propagation can be compact.

As illustrated in, for example, FIGS. 1, 2, and 4, the second waveguide 42 may be between the first waveguide 41 and the third waveguide 43, or may be nearest the central axis of the second merging portion 45. In this case, the second waveguide 42 can be a waveguide with smaller bending, or a linear waveguide.

The second light emitter 22 being a green semiconductor laser has a lower level of luminous efficiency than the first light emitter 21 being a blue semiconductor laser and the third light emitter 23 being a red semiconductor laser. The second waveguide 42 may be a waveguide with smaller bending, or a linear waveguide to have reduced bending loss in the second waveguide 42. This allows green light to propagate with low loss. In the present embodiment, the light source module 100 can thus output white light with a color temperature and color rendering adjusted appropriately.

Of the first incident surface 41a, the second incident surface 42a, and the third incident surface 43a, the first incident surface 41a and the third incident surface 43a may be oriented toward the central axis of the second merging portion 45. In FIG. 7, the second incident surface 42a is also oriented toward the central axis of the second merging portion 45. The first incident surface 41a, the second incident surface 42a, and the third incident surface 43a respectively form angles θ1, θ2, and θ3 less than or equal to 35 degrees with a plane perpendicular to the central axis of the second merging portion 45. FIG. 7 illustrates an imaginary line extending from the central axis of the second merging portion 45 and perpendicular lines 45a each indicating a plane perpendicular to the imaginary line. With this structure, the first waveguide 41, the second waveguide 42, and the third waveguide 43 may be arranged in a bloom shape. This structure reduces the spacing between adjacent light emitters 20 in the width direction (Y-direction) as illustrated in, for example, FIG. 7. For light emitters 20 with a width of about 100 to 400 μm, the angles θ1 and θ3 may be set to 5 to 35 degrees inclusive to minimize the spacing in the width direction, although the setting may depend on the chip size of the light emitters 20. This reduces the dimension of the light source module 100 in the width direction (Y-direction).

When the first incident surface 41a, the second incident surface 42a, and the third incident surface 43a define the above structure, adjacent light emitters 20 may overlap each other in the length direction (X-direction). This further reduces the dimension of the light source module 100 in the width direction (Y-direction).

With the first incident surface 41a, the second incident surface 42a, and the third incident surface 43a defining the above structure, the waveguides 40 have smaller bending and thus have reduced bending loss, thus efficiently combining light beams emitted from the light emitters 20.

The second incident surface 42a may form a smaller angle with the perpendicular line 45a than the first incident surface 41a and the third incident surface 43a. Thus, the second waveguide 42, which transmits light emitted from the second light emitter 22 with a low level of luminous efficiency, has smaller bending and thus has reduced bending loss, transmitting light emitted from the second light emitter 22 with low loss. The light source module can thus output white light with a color temperature and color rendering adjusted appropriately.

The third incident surface 43a may form a smaller angle with the perpendicular line 45a than the first incident surface 41a. Thus, the third waveguide 43, which transmits light with the third wavelength that is likely to have bending loss, has smaller bending and thus has reduced bending loss, transmitting light emitted from the third light emitter 23 with low loss. The light source module can thus output white light with a color temperature and color rendering adjusted appropriately.

As illustrated in, for example, FIG. 8, the first incident surface 41a may be nearer the emission portion 46 than the second incident surface 42a and the third incident surface 43a. In this structure, the first waveguide 41 can be shorter in the direction of light propagation than the second waveguide 42 and the third waveguide 43. In FIG. 8, the position of the first light emitter 21 in the light source module 100 and the profile of the substrate 1 in FIG. 7 are indicated by the two-dot-dash lines. As illustrated in FIG. 8, the first light emitter 21 may be located nearer the first merging portion 44 to overlap the second light emitter 22 in the length direction (X-direction). This reduces the dimension of the light source module 100 in the width direction (Y-direction), allowing the light source module 100 to be compact.

With the first light emitter 21 nearer the first merging portion 44, the first light emitter 21 and the second light emitter 22 may partially overlap each other in the length direction (X-direction) and may also have their light emission surfaces overlapping each other. This structure further reduces the dimension of the light source module 100 in the width direction (Y-direction), allowing the light source module 100 to be further compact.

With the first incident surface 41a nearer the emission portion 46 than the second incident surface 42a and the third incident surface 43a, the first waveguide 41 may have greater bending. However, the first waveguide 41 is shorter and thus reduces an increase in loss resulting from the bending. The light source module can thus transmit light emitted from the first light emitter 21 with low loss and can output white light with a color temperature and color rendering adjusted appropriately.

As illustrated in, for example, FIG. 3, the cladding 3 may include a second surface 3a that is a lower surface facing the substrate 1 and a third surface 3b that is an upper surface opposite to the second surface 3a. The cladding 3 may include three through-holes 33 extending from the third surface 3b through the second surface 3a. The first light emitter 21, the second light emitter 22, and the third light emitter 23 may be received in the respective three through-holes 33 as illustrated in, for example, FIG. 1. The through-holes 33 may be sized to receive the first to third light emitters 21, 22, and 23, and thus to have minimum openings. This increases the rigidity of the cladding 3 and reduces deformation of the cladding 3 and the core 4 in the cladding 3. In particular, the inner side surfaces of the through-holes 33 including the incident surfaces 41a, 42a, and 43a of the core 4 have less deformation, thus allowing light emitted from the first to third light emitters 21, 22, and 23 to efficiently enter the core 4. As illustrated in, for example, FIG. 4, the through-holes 33 may be sized to fit the profiles of the first to third light emitters 21, 22, and 23. The first to third light emitters 21, 22, and 23 are simply placed into the corresponding through-holes 33 for easy positioning.

The through-holes 33 may be replaced by a single through-hole 34 as illustrated in, for example, FIG. 9, rather than being formed for the respective emitters. The first light emitter 21, the second light emitter 22, and the third light emitter 23 may all be received in the single through-hole 34. The single through-hole 34 may have an opening including the openings of the three through-holes 33. This structure reduces the likelihood that each light emitter 20 strikes against the opening edge or the inner peripheral surface of the through-hole 34 when the light emitter 20 is mounted on the substrate 1, facilitating the process for mounting the light emitters 20 onto the substrate 1. The first incident surface 41a, the second incident surface 42a, and the third incident surface 43a can be at the same positions in the through-holes 33 for the respective emitters and also in the single through-hole 34. For the through-holes 33 for the respective emitters, for example, at least either the width (in Y-direction in the figure) or the length (in X-direction in the figure) of each through-hole 33 may be greater than the corresponding dimension of the light emitter 20. This reduces the likelihood that each light emitter 20 strikes against the opening edge or the inner peripheral surface of the corresponding through-hole 33 when the light emitter 20 is mounted on the substrate 1. In this case as well, the cladding 3 has higher rigidity than in the structure with a larger single through-hole 34.

As illustrated in, for example, FIGS. 1 and 3, the light source module 100 may further include a lid 6, a seal ring 7, and a condenser lens 8.

The lid 6 is located above the third surface 3b of the cladding 3 and covers the first light emitter 21, the second light emitter 22, and the third light emitter 23. The seal ring 7 is between the lid 6 and the cladding 3. The seal ring 7 is a continuous loop surrounding the openings of all the three through-holes 33 in a plan view. The seal ring 7 improves the airtightness of the space accommodating the light emitters 20. This structure is also usable for the cladding 3 including the single through-hole 34 to more noticeably reduce deformation of the cladding 3 and the core 4.

The lid 6 may be directly joined to the cladding 3 by, for example, heating. However, the cladding 3 and the core 4 may deform under stress during heating. This may cause misalignment of the optical axes between the light emitters 20 and the core 4. The seal ring 7 surrounding the through-holes 33 increases the mechanical strength around the through-holes 33 and reduces deformation of the cladding 3 and the core 4. This reduces misalignment of the optical axes between the light emitters 20 and the core 4.

The lid 6 may be made of, for example, a glass material such as quartz, borosilicate glass, or sapphire. The lid 6 may be made of a metal such as Fe, Ni, or Co or an alloy containing any of these metals, or may be made of silicon. The seal ring 7 may be made of, for example, a metal such as Ti, Ni, Au, Pt, or Cr or an alloy of any of these metals. The seal ring 7 is fixed to the third surface 3b of the cladding 3 by, for example, vapor deposition, sputtering, ion plating, or plating. The lid 6 may be joined to the seal ring 7 by, for example, thermal curing or laser welding using a bond, such as Au—Sn or Sn—Ag—Cu solder, a metal nanoparticle paste of, for example, Ag or Cu, or a glass paste.

The seal ring 7 may be located on the lid 6, rather than on the cladding 3, in a portion facing the cladding 3. The seal ring 7 may be made of, for example, a metal such as Ti, Ni, Au, Pt, or Cr or an alloy of any of these metals. The seal ring 7 may be fixed to the lid 6 by, for example, vapor deposition, sputtering, ion plating, or plating. The cladding 3 may be joined to the seal ring 7 by, for example, thermal curing or laser welding using a bond, such as Au—Sn or Sn—Ag—Cu solder, a metal nanoparticle paste of, for example, Ag or Cu, or a glass paste.

The seal ring 7 may be located on each of the cladding 3 and the lid 6. The seal ring 7 on the cladding 3 and the seal ring 7 on the lid 6 may be joined together by, for example, thermal curing or laser welding using a bond, such as Au—Sn or Sn—Ag—Cu solder, a metal nanoparticle paste of Ag or Cu, or a glass paste. The cladding 3 and the lid 6 may be joined together with high airtightness without any seal ring 7.

The condenser lens 8 is located on the optical path of light emitted through the emission portion 46. The condenser lens 8 may collimate light emitted through the emission portion 46 or condense light emitted through the emission portions 46. As illustrated in, for example, FIG. 3, the condenser lens 8 may be a plano-convex lens with an incident surface facing the emission portion 46 being flat and an emission surface being convex.

The light source module 100 further includes multiple electrodes 9 for providing a drive current to the light emitters 20. In the present embodiment, two electrodes 9 are located for each of the first light emitter 21, the second light emitter 22, and the third light emitter 23 as illustrated in, for example, FIGS. 1, 2, and 4. The two electrodes 9 may be two parallel wiring strips arranged on the first surface 1a of the substrate 1. In a plan view, each wiring strip may have one end located in an area surrounded by the inner peripheral surface of the corresponding through-hole 33 in the first surface 1a, and the other end exposed from the cladding 3 in the first surface 1a. Each wiring strip has one end electrically connected to the electrode (positive electrode or negative electrode) of the corresponding light emitter 20, and the other end electrically connected to an external power circuit.

The present disclosure may be implemented in the following forms.

In one or more embodiments of the present disclosure, a light source module 100 includes a first light emitter 21 that emits light with a first wavelength, a second light emitter 22 that emits light with a second wavelength different from the first wavelength, and a third light emitter 23 that emits light with a third wavelength different from the first wavelength and the second wavelength, a cladding 3, and a core 4 in the cladding 3. The core 4 includes a first waveguide 41 that transmits light emitted from the first light emitter 21, a second waveguide 42 that transmits light emitted from the second light emitter 22, a third waveguide 43 that transmits light emitted from the third light emitter 23, a first merging portion 44 in which two waveguides of the first waveguide 41, the second waveguide 42, or the third waveguide 43 merge, a second merging portion 45 in which the first merging portion 44 merges with a waveguide other than the two waveguides of the first waveguide 41, the second waveguide 42, or the third waveguide 43, and an emission portion 46 at one end of the second merging portion 45.

In one or more embodiments of the present disclosure, the light source module 100 is compact and has a simple structure that can efficiently combine light beams with different wavelengths.

Although embodiments of the present disclosure have been described in detail, the present disclosure is not limited to the embodiments described above, and may be changed or varied in various manners without departing from the spirit and scope of the present disclosure. The components described in the above embodiments may be entirely or partially combined as appropriate unless any contradiction arises.

REFERENCE SIGNS 100 light source module
1 substrate
1a one main surface (first surface)
20 light emitter
21 first light emitter
22 second light emitter
23 third light emitter
3 cladding
3a lower surface (second surface)
3b upper surface (third surface)
31 lower cladding layer
32 upper cladding layer
32a ridge
33, 34 through-hole
4 core
40 waveguide
41 first waveguide
41a first incident surface
42 second waveguide
42a second incident surface
43 third waveguide
43a third incident surface
44 first merging portion
45 second merging portion
45a perpendicular line
46 emission portion
5 optical waveguide layer
6 lid
7 seal ring
8 condenser lens
9 electrode

The invention claimed is:

1. A light source module, comprising:
a first light emitter configured to emit light with a first wavelength;
a second light emitter configured to emit light with a second wavelength different from the first wavelength;
a third light emitter configured to emit light with a third wavelength different from the first wavelength and the second wavelength;
a cladding; and
a core in the cladding, the core including
a first waveguide configured to transmit light emitted from the first light emitter,
a second waveguide configured to transmit light emitted from the second light emitter,
a third waveguide configured to transmit light emitted from the third light emitter,
a first merging portion in which two waveguides of the first waveguide, the second waveguide, or the third waveguide merge,
a second merging portion in which the first merging portion merges with a waveguide other than the two waveguides of the first waveguide, the second waveguide, or the third waveguide, and
an emission portion at one end of the second merging portion, wherein the second wavelength is longer than the first wavelength, and the third wavelength is longer than the second wavelength;
wherein the first waveguide and the second waveguide merge in the first merging portion, and
the third waveguide and the first merging portion merge in the second merging portion.

2. The light source module according to claim 1, wherein the second waveguide is between the first waveguide and the third waveguide in a plan view.

3. The light source module according to claim 1, wherein the first waveguide includes a first incident surface facing a light emission surface of the first light emitter to receive light emitted from the first light emitter,
the second waveguide includes a second incident surface facing a light emission surface of the second light emitter to receive light emitted from the second light emitter,
the third waveguide includes a third incident surface facing a light emission surface of the third light emitter to receive light emitted from the third light emitter,
the second merging portion extends linearly,
the first incident surface and the third incident surface are oriented toward a central axis of the second merging portion, and
each of the first incident surface, the second incident surface, and the third incident surface forms an angle less than or equal to 35 degrees with a plane perpendicular to the central axis.

4. The light source module according to claim 3, wherein the first incident surface is nearer the emission portion than the second incident surface and the third incident surface, and the first waveguide is shorter than the second waveguide and the third waveguide in a direction of light propagation.

5. The light source module according to claim 1, further comprising:
a substrate including a first surface, the substrate receiving the first light emitter, the second light emitter, the third light emitter, and the cladding on the first surface;
a lid above the first surface, the lid covering the first light emitter, the second light emitter, and the third light emitter; and
a condenser lens on an optical path of light emitted through the emission portion.

6. The light source module according to claim 5, wherein the cladding includes a second surface facing the substrate, a third surface opposite to the second surface, and three through-holes extending from the second surface through the third surface, and the first light emitter, the second light emitter, and the third light emitter are received in the respective three through-holes.

\* \* \* \* \*